United States Patent
Mayberry et al.

(10) Patent No.: US 10,010,020 B2
(45) Date of Patent: Jun. 26, 2018

(54) ULTRASONIC CONSOLIDATION WITH INTEGRATED PRINTED ELECTRONICS

(71) Applicant: Raytheon Company, Waltham, MA (US)

(72) Inventors: Travis Mayberry, Lewisville, TX (US); Jeffrey A. Shubrooks, South Boston, MA (US)

(73) Assignee: RAYTHEON COMPANY, Waltham, MA (US)

(*) Notice: Subject to any disclaimer, the term of this patent is extended or adjusted under 35 U.S.C. 154(b) by 331 days.

(21) Appl. No.: 14/847,620

(22) Filed: Sep. 8, 2015

(65) Prior Publication Data

US 2017/0071083 A1    Mar. 9, 2017

(51) Int. Cl.
  B32B 37/00    (2006.01)
  H05K 13/04    (2006.01)
  H05K 1/02     (2006.01)
  H05K 3/14     (2006.01)

(52) U.S. Cl.
  CPC ....... *H05K 13/0404* (2013.01); *H05K 1/0272* (2013.01); *H05K 3/14* (2013.01); *H05K 2201/064* (2013.01); *H05K 2203/0285* (2013.01)

(58) Field of Classification Search
  CPC . B29C 65/08; B29C 66/9516; B29C 66/9161; B23K 20/10
  USPC ....................................................... 156/73.1
  See application file for complete search history.

(56) References Cited

U.S. PATENT DOCUMENTS

| | | | |
|---|---|---|---|
| 6,463,349 B2 | 10/2002 | White | |
| 6,519,500 B1 | 2/2003 | White | |
| 6,814,823 B1 | 11/2004 | White | |
| 8,513,562 B2 | 8/2013 | Bichsel | |
| 2002/0112804 A1* | 8/2002 | Woods | B29C 65/08 156/73.1 |
| 2004/0071862 A1 | 4/2004 | White et al. | |
| 2006/0142140 A1 | 6/2006 | White | |
| 2006/0251805 A1 | 11/2006 | White | |
| 2007/0040702 A1 | 2/2007 | Mosher | |
| 2007/0295440 A1 | 12/2007 | Stucker | |
| 2008/0212266 A1 | 9/2008 | White | |
| 2009/0296345 A1 | 12/2009 | Nguyen | |
| 2011/0065888 A1* | 3/2011 | Inston | B29C 35/0261 156/73.1 |

OTHER PUBLICATIONS

PCT Application No. PCT/US16/50522, ISR/WO, dated Dec. 21, 2016, RAY0314PCT, 10 pages.

* cited by examiner

*Primary Examiner* — James Sells
(74) *Attorney, Agent, or Firm* — Cantor Colburn LLP (57) ABSTRACT

A machine is provided and includes a machine body formed to define a single enclosed space, an ultrasonic consolidation (UC) processing element operably disposed in the single enclosed space for executing UC processing of a part within the single enclosed space and an electronics printing element operably disposed in the single enclosed space for executing electronics printing of the part within the single enclosed space.

20 Claims, 11 Drawing Sheets

ULTRASONIC CONSOLIDATION WITH INTEGRATED PRINTED ELECTRONICS

BACKGROUND

The present disclosure relates to an ultrasonic consolidation (UC) and, more particularly, to a UC machine and a method of using a UC machine to form integrated printed electronics.

UC is a process in which very thin strips of material are laid down and ultrasonically welded together (similar to friction stir welding) to create a low temperature, permanent bond joint. Generally, UC does not allow for the inclusion or addition of electronics or electrical features in the same process as the ultrasonic welding. Meanwhile, traditional assembly methods for assembling substrates populated with electronics onto housings using standard methods, such as bolted joints and wedgelocks, do not typically provide paths for easy anti-tamper implementations. In addition, for thermal dissipation of mounted electronics, heat must be conducted through the mounting substrate to a secondary thermal sink and this tends to result in material thermal resistance and additional edge temperature increases.

That is, for parts formed by way of conventional UC processing, electronic devices like simple sensors are manually inserted during the UC processing and for more complex structures printing of electronics is often required. Therefore, if a part is to be formed by way of UC processing and has printed electronics integrated in or on the structure, the UC fabrication process must be stopped so that the part can be transferred to a separate machine for printing electronics and then transferred back to the UC machine. This would be repeated as many times as necessary until the assembly of the desired part is completed.

The repeated stopping and restarting of the UC process and the repeated transfer of the part out of the UC processing machine to the electronics printing machine and vice versa may lead to tolerance and alignment issues that negatively affect yield, fabrication time and costs.

SUMMARY

According to one embodiment, a machine is provided and includes a machine body formed to define a single enclosed space, an ultrasonic consolidation (UC) processing element operably disposed in the single enclosed space for executing UC processing of a part within the single enclosed space and an electronics printing element operably disposed in the single enclosed space for executing electronics printing of the part within the single enclosed space.

According to another embodiment, a method of forming a part in a machine formed to define a single enclosed space is provided. The method includes executing ultrasonic consolidation (UC) processing of a part within the single enclosed space, executing electronics printing of the part within the single enclosed space and continuously maintaining a position of the part within the enclosed space during transitions between executions of the UC processing and the electronics printing.

According to another embodiment, a method of forming a part in a machine formed to define a single enclosed space is provided. The method includes executing ultrasonic consolidation (UC) processing to assemble base and uppermost layers of the part within the single enclosed space, machining thermal channels in a first portion of the base and uppermost layers within the single enclosed space, printing dielectric and conductive electronic components on a second portion of the base and uppermost layers within the single enclosed space and continuously maintaining a position of the part within the enclosed space during transitions between executions of the UC processing, the machining and the printing.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

For a more complete understanding of this disclosure, reference is now made to the following brief description, taken in connection with the accompanying drawings and detailed description, wherein like reference numerals represent like parts.

DETAILED DESCRIPTION

As will be described below, a single machine is provided that is configured to perform combined ultrasonic consolidation (UC) processing as well as electronics printing processing to thus enable extremely unique part designs. The single machine provides for UC manufacturing of structures with an integrated printing head (such as a printing head capable of aerosol jet printing, deposition or other printing techniques) for printing of dielectrics, conductors, resistors, etc., and includes pick and place capabilities for assembly of complex components onto printed traces. The pick and place capabilities could also be used for placement of prefabricated electrical boards or subassemblies to create an inseparable electro-mechanical assembly. The machine also allows for feedback sensors, such as stress sensors, strain sensors, temperature sensors, etc., to be printed in or on the assembly for in-situ health monitoring and for conductive grids to be printed inside structure housings for monitoring of unwanted entries. As such, by way of the machine, electronics can be completely enclosed inside metal structures to create an inseparable assembly with high power dissipating electronics placed directly on top of integral thermal sinks on the metal structures for higher efficiency cooling.

It is to be understood that UC processing may also be referred to as ultrasonic additive manufacturing (UAM). The use of the UC terminology herein is provided for clarity and brevity and is not intended to otherwise limit the scope of the application as a whole.

Figure 1A:
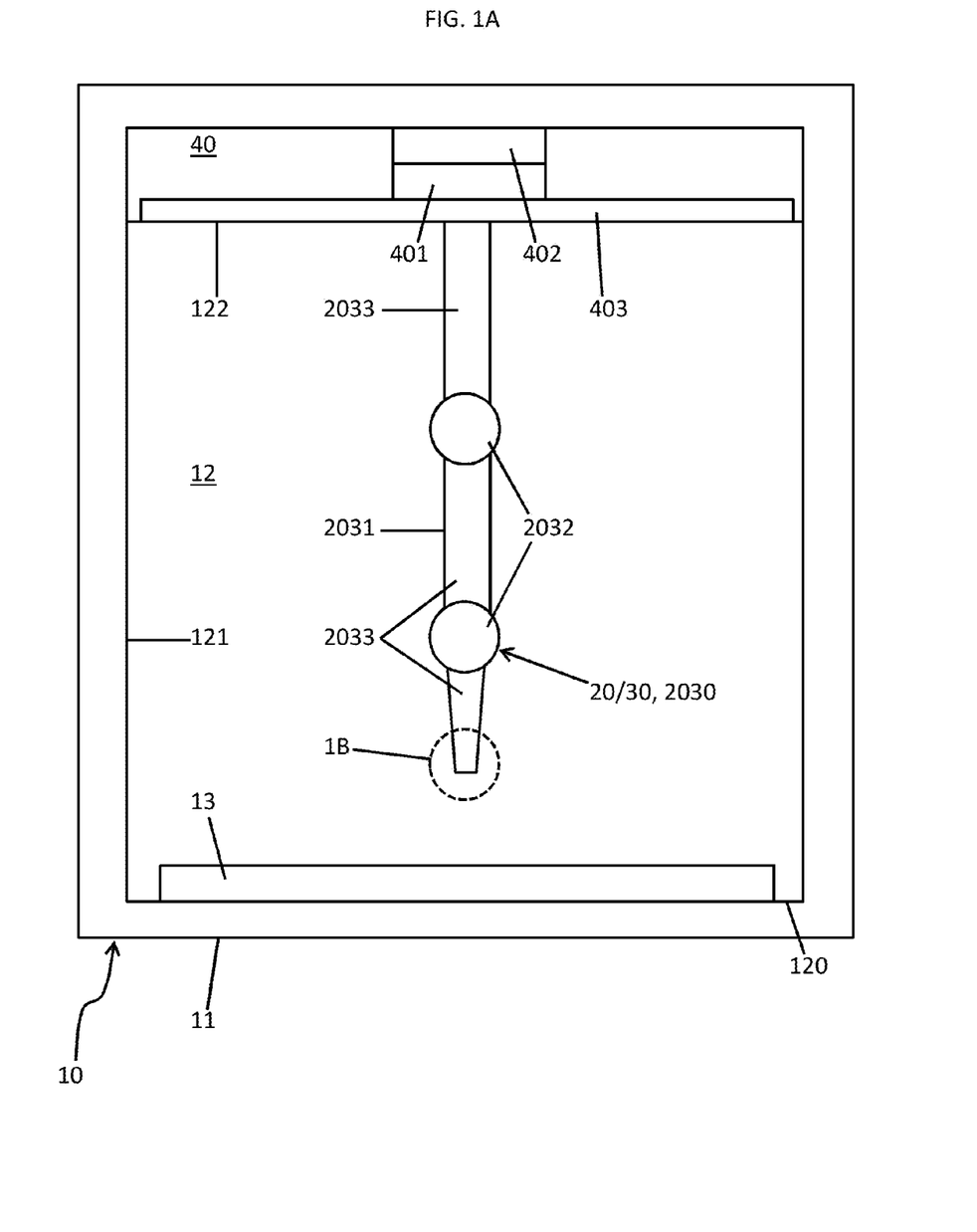
FIG. 1A is a schematic diagram illustrating a single machine for performing combined ultrasonic consolidation (UC) processing as well as electronics printing processing in accordance with embodiments.
Figure 1B:
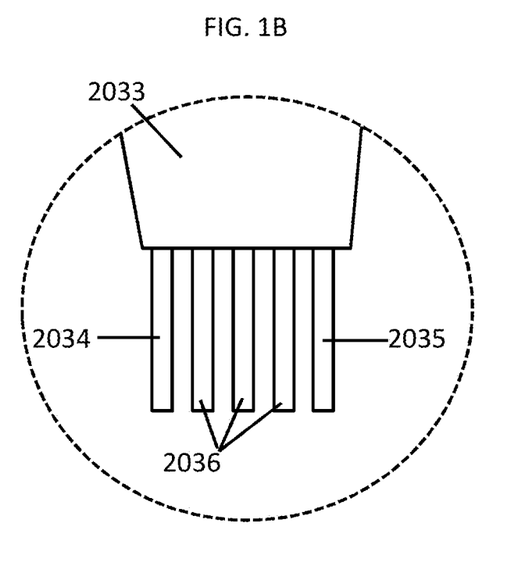
FIG. 1B is an enlarged view of the encircled area 1B of FIG. 1A.

With reference to FIGS. 1A and 1B, a combined UC processing and electronics printing machine 10 (hereinafter referred to as a "machine 10") is provided. The machine 10 includes a machine body 11 having a predefined length, width and height such that the machine body 11 is a volumetric body and is formed to define a single enclosed space 12 therein. The single enclosed space 12 includes a lower base wall 120 on which a jig 13 is disposable, sidewalls 121 extending upwardly from the lower base wall 120 and a ceiling 122 disposed above the lower base wall 120. Although not shown, the machine 10 may further include a door that is hingedly coupled to a side of the single enclosed space 12 to provide user access to the interior of the single enclosed space 12.

The machine 10 also includes a UC processing element 20, an electronics printing element 30 and a controller 40. The UC processing element 20 is operably disposed in the single enclosed space 12 and is configured for executing UC processing of a part (see FIGS. 5 and 6) that is disposable on the jig 13 within the single enclosed space 12. The electronics printing element 30 is similarly operably disposed in the single enclosed space 12 and is configured for executing electronics printing of the part within the single enclosed space 12. The controller 40 is coupled to the UC processing element 20 and the electronics printing element 30 and is thereby configured to control various operations of the UC processing element 20 and the electronics printing element 30 in accordance with predefined design algorithms and commands. The controller 40 may include a processing element 401, a memory 402 having executable instructions stored thereon and servo control elements 403. When executed, the executable instructions cause the processing element 401 to control the various components described herein by way of the servo control elements 403.

In accordance with embodiments and, as shown in FIG. 1A, the UC processing element 20 and the electronics printing element 30 may be integrated into a single processing element 2030. This single processing element 2030 may include a single arm 2031, which is anchored to the machine body 11 at, for example the ceiling 122, and which is capable of movement in multiple directions with multiple degrees of freedom. The movement of the single arm 2031 in the multiple directions with the multiple degrees of freedom may be enabled by the structure of the single arm 2031, which includes, for example, first and second elbows 2032 interleaved between elongate portions 2033 such that each elongate portion 2033 is rotatable relative to any adjacent elongate portion 2033.

As shown in FIG. 1B, the single processing element 2030 may further include a UC head 2034 and an electronics printing head 2035. The UC head 2034 is coupled to a distal end of a lowermost elongate portion 2033 of the single arm 2031 and is configured to execute UC processing of the part. The electronics printing head 2035 is similarly coupled to the distal end of the lowermost elongate portion 2033 of the single arm 2031 and is configured to execute electronics printing of the part.

As used herein, the UC processing of the part refers to an additive manufacturing technique involving the ultrasonic welding of metal foils. In UC processing, a sonotrode locally applies pressure and high-frequency (typically 20,000 hertz) ultrasonic vibrations to the metal foils to create a solid-state weld at a relatively low temperature. Thus, the UC head 2034 may include at least a sonotrode element. The electronics printing of the part refers to various printing techniques, such as, but not limited to, aerosol jet printing and depositional printing. Thus, the electronics printing head 2035 may include at least a pressurized aerosol container, a nozzle and a conduit by which the nozzle is fluidly communicative with the pressurized aerosol container.

In accordance with further embodiments, the single processing element 2030 may include additional head components 2036 for execution of additional part processing along with the UC head 2034 and the electronics printing head 2035. Such additional head components 2036 may include at least one or more of a pick and place component for permitting picking (e.g., vacuum powered or magnetic picking) and placing of complex electronic components onto the part, a machining component for milling, cutting or machining the part to a desired shape and size and an additional electronics printing component. Thus, with the UC head 2034, the electronics printing head 2035 and the additional head components 2036 all integrated within the single processing element 2030, the part may be formed and assembled within the single enclosed space 12 by way of controlled movements and operations of only the single processing element 2030 as controlled by the controller 40.

Figure 2A:
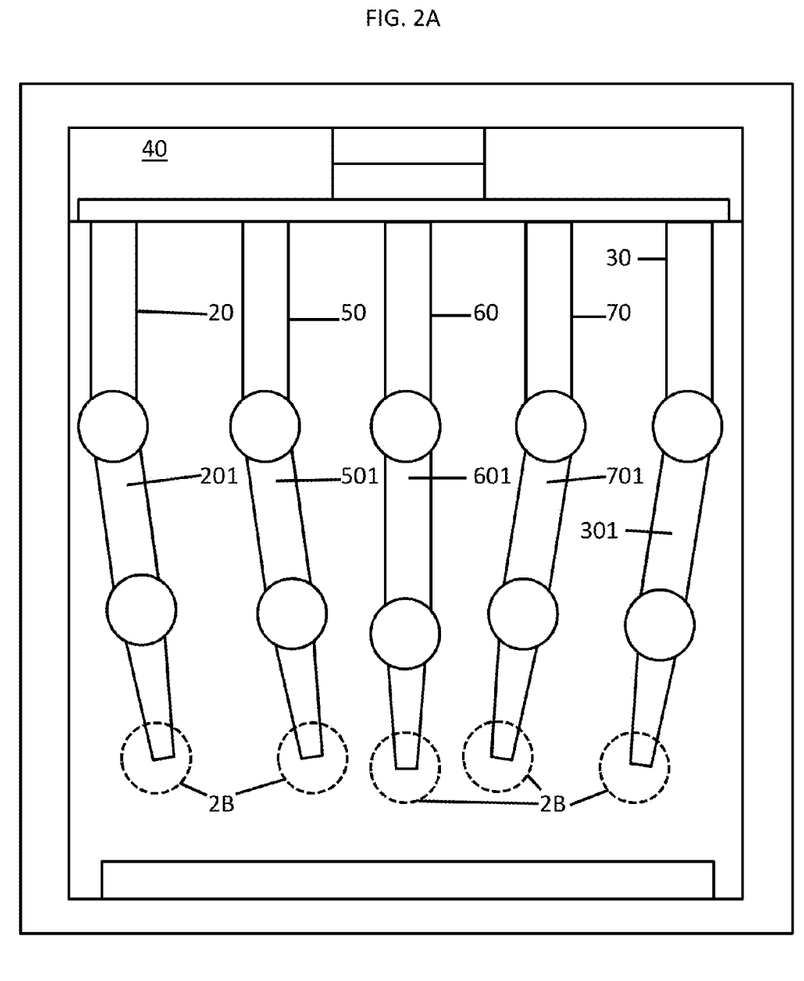
FIG. 2A is a schematic diagram illustrating a single machine for performing combined ultrasonic consolidation (UC) processing as well as electronics printing processing in accordance with embodiments.
Figure 2B:
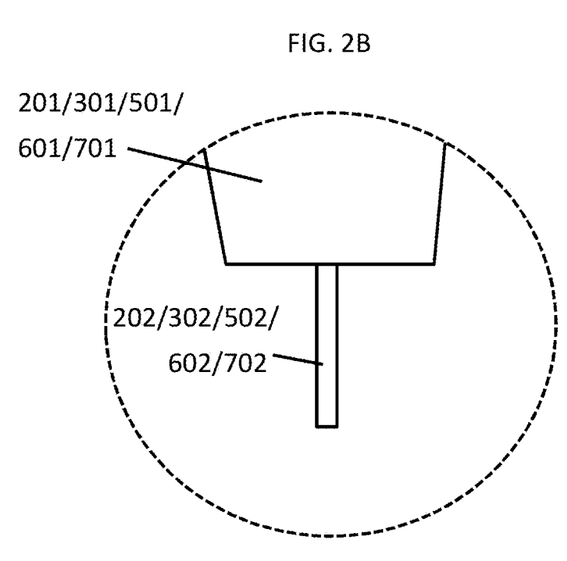
FIG. 2B is an enlarged view of the encircled areas 2B of FIG. 2A.

With reference to FIGS. 2A and 2B, alternative embodiments of the machine 10 are illustrated and the following description will relate only to those components that are different from those of the embodiments of FIGS. 1A and 1B.

As shown in FIG. 2A, the UC processing element 20, the electronics printing element 30, a pick and place element 50, a machining element 60 and an additional electronics printing element 70 are provided separately within the single enclosed space 12. That is, the UC processing element 20 is provided on a UC processing arm 201, the electronics printing element 30 is provided on an electronics printing arm 301, the pick and place element 50 is provided on a pick and place arm 501, the machining element 60 is provided on a machining arm 601 and the additional electronics printing element 70 is provided on an additional electronics printing arm 701. Each arm is anchored to the machine body 11 at, for example the ceiling 122, and is capable of movement in multiple directions with multiple degrees of freedom. The movement of the arms in the multiple directions with the multiple degrees of freedom may be enabled by their respective structures which are similar to the arm structures described above and need not be repeated.

As shown in FIG. 2B, a UC head 202 is coupled to a distal end of a lowermost elongate portion of the UC processing arm 201, an electronics printing head 302 is coupled to a distal end of the lowermost elongate portion of the electronics printing arm 301, a pick and place head 502 is coupled to a distal end of the lowermost elongate portion of the pick and place arm 501, a machining head 602 is coupled to a distal end of the lowermost elongate portion of the machining arm 601 and an additional electronics printing head 702 is coupled to a distal end of the lowermost elongate portion of the additional electronics printing arm 701. Thus, in the alternative embodiments of FIGS. 2A and 2B, the part may be formed and assembled within the single enclosed space 12 by way of controlled movements and operations of each of the arms as controlled by the controller 40.

With reference to FIGS. 3A-3D, alternative embodiments of the machine 10 are illustrated and the following description will relate only to those components that are different from those of the embodiments of FIGS. 1A and 1B and FIGS. 2A and 2B.

Figure 3A:
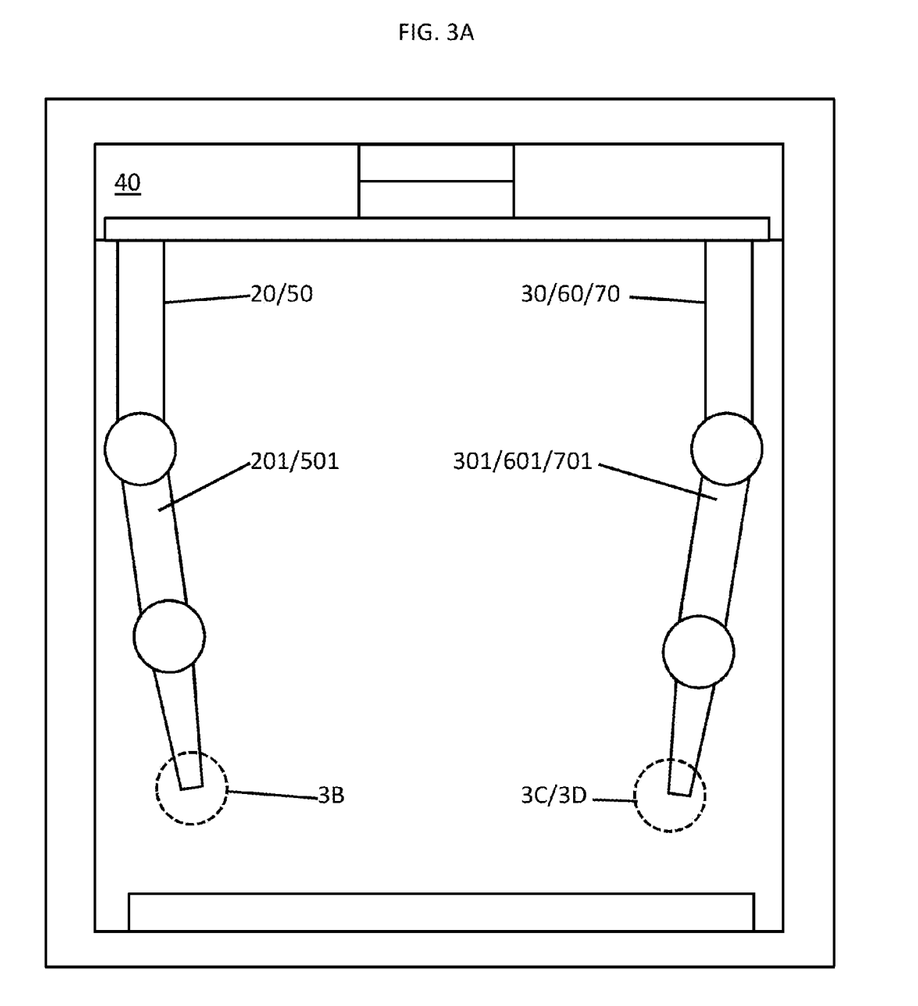
FIG. 3A is a schematic diagram illustrating a single machine for performing combined ultrasonic consolidation (UC) processing as well as electronics printing processing in accordance with embodiments.

As shown in FIG. 3A, the UC processing element 20, the electronics printing element 30, a pick and place element 50, a machining element 60 and an additional electronics printing element 70 are provided in sub-groups within the single enclosed space 12. That is, the UC processing element 20 is provided on a UC processing arm 201 and the electronics printing element 30 is provided on an electronics printing arm 301. The pick and place element 50, the machining element 60 and the additional electronics printing element 70 may each be provided on either of the UC processing arm 201 and the electronics printing arm 301.

Figure 3B:
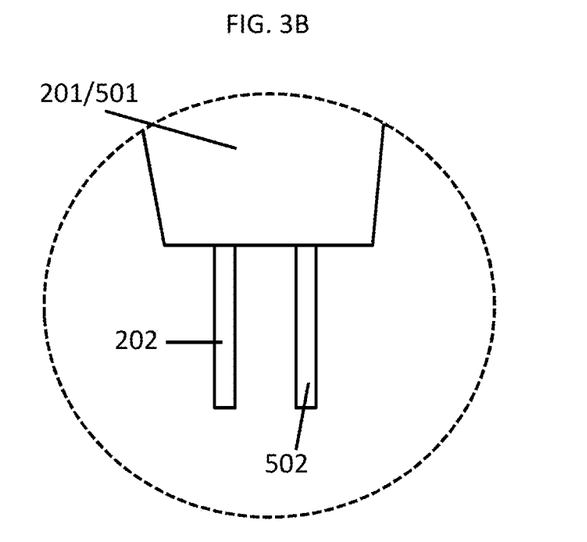
FIG. 3B is an enlarged view of the encircled area 3B of FIG. 3A.
Figure 3C:
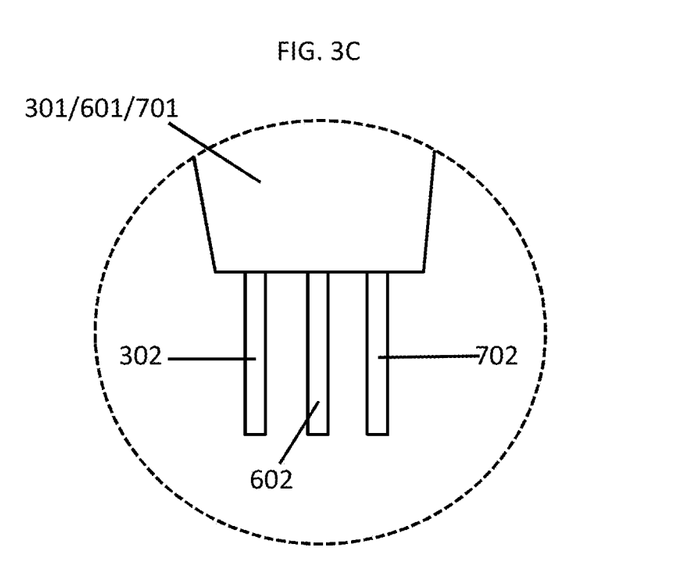
FIG. 3C is an enlarged view of the encircled area 3C of FIG. 3A.
Figure 3D:
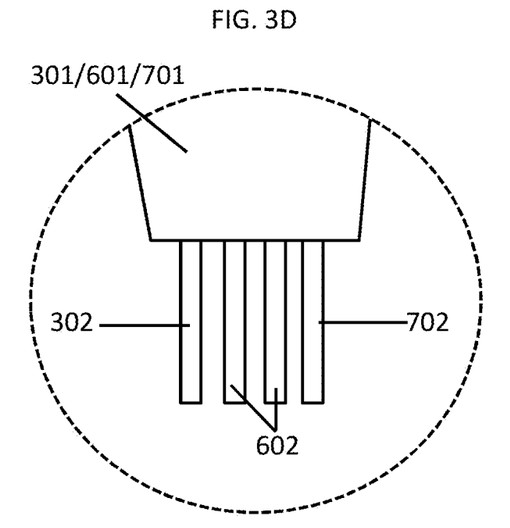
FIG. 3D is an enlarged view of the encircled area 3D of FIG. 3A.

As shown in FIGS. 3B and 3C, a UC head 202 is coupled to a distal end of a lowermost elongate portion of the UC processing arm 201 and an electronics printing head 302 is coupled to a distal end of the lowermost elongate portion of the electronics printing arm 301. The pick and place head 502, the machining head 602 and the additional electronics printing head 702 may each be coupled to a distal end of the lowermost elongate portion of either of the UC processing arm 201 and the electronics printing arm 301. FIG. 3D is an alternative embodiment of the embodiment of FIG. 3C and illustrates that at least one of the UC head 202, the electronics printing head 302, the pick and place head 502, the machining head 602 and the additional electronics printing head 702 may be provided redundantly on both of the UC processing arm 201 and the electronics printing arm 301. Thus, in the alternative embodiments of FIGS. 3A-3D, the part may be formed and assembled within the single enclosed space 12 by way of controlled movements and operations of only the UC processing arm 201 and the electronics printing arm 301 as controlled by the controller 40.

Figure 4A:
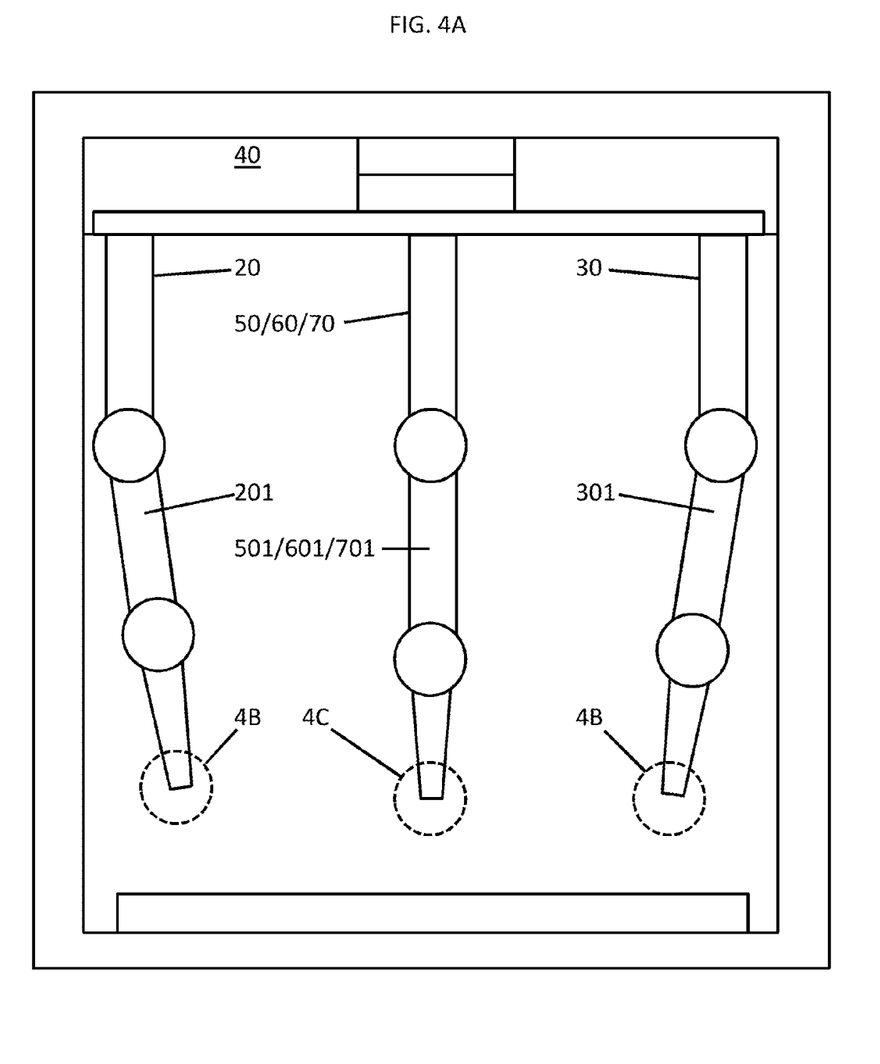
FIG. 4A is a schematic diagram illustrating a single machine for performing combined ultrasonic consolidation (UC) processing as well as electronics printing processing in accordance with embodiments.
Figure 4B:
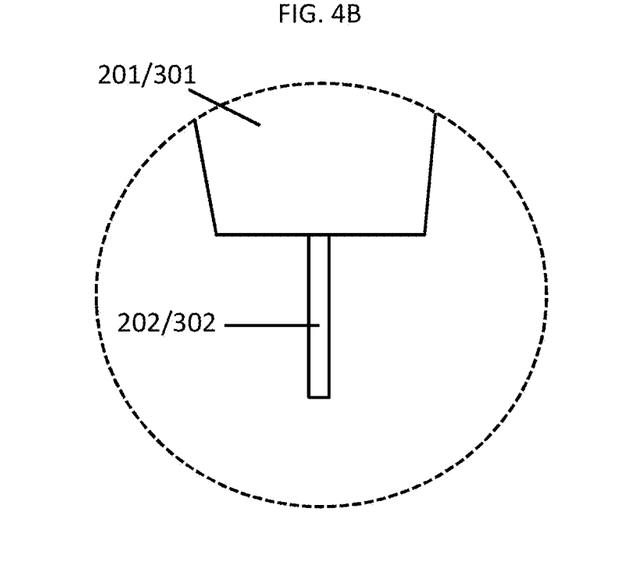
FIG. 4B is an enlarged view of the encircled areas 4B of FIG. 4A.
Figure 4C:
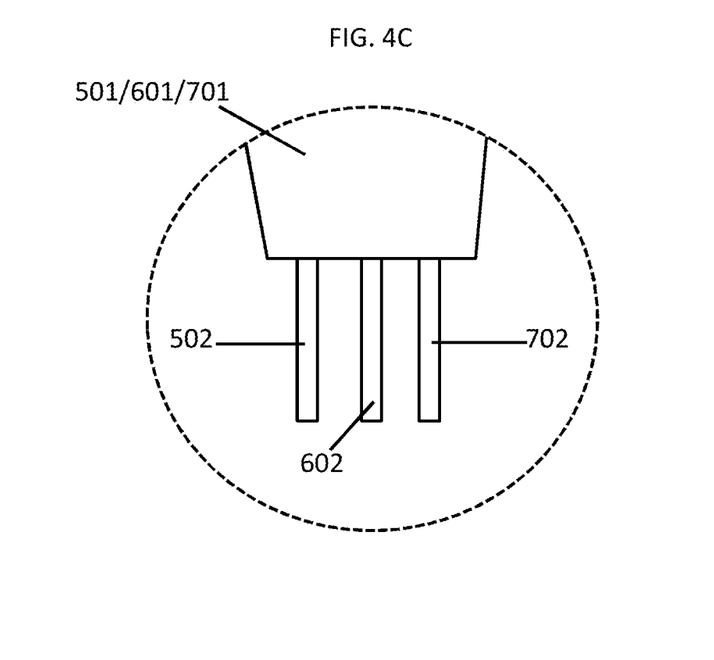
FIG. 4C is an enlarged view of the encircled area 4C of FIG. 4A.

With reference to FIGS. 4A-4C, alternative embodiments of the machine 10 are illustrated and the following description will relate only to those components that are different from those of the embodiments of FIGS. 1A and 1B and FIGS. 2A and 2B.

As shown in FIG. 4A, the UC processing element 20, the electronics printing element 30 and a subgrouping of the pick and place element 50, the machining element 60 and the additional electronics printing element 70 are provided separately within the single enclosed space 12. That is, the UC processing element 20 is provided on a UC processing arm 201, the electronics printing element 30 is provided on an electronics printing arm 301 and the subgrouping of the pick and place element 50, the machining element 60 and the additional electronics printing element 70 is provided on a subgroup arm 801.

As shown in FIG. 4B, the UC head 202 is coupled to a distal end of a lowermost elongate portion of the UC processing arm 201 and the electronics printing head 302 is coupled to a distal end of the lowermost elongate portion of the electronics printing arm 301. Meanwhile, as shown in FIG. 4C, the pick and place head 502, the machining head 602 and the additional electronics printing head 702 are coupled to a distal end of the lowermost elongate portion of the subgroup arm 801. Thus, in the alternative embodiments of FIGS. 4A-4C, the part may be formed and assembled within the single enclosed space 12 by way of controlled movements and operations of each of the UC processing arm 201, the electronics printing arm 301 and the subgroup arm 801 as controlled by the controller 40.

Figure 5:
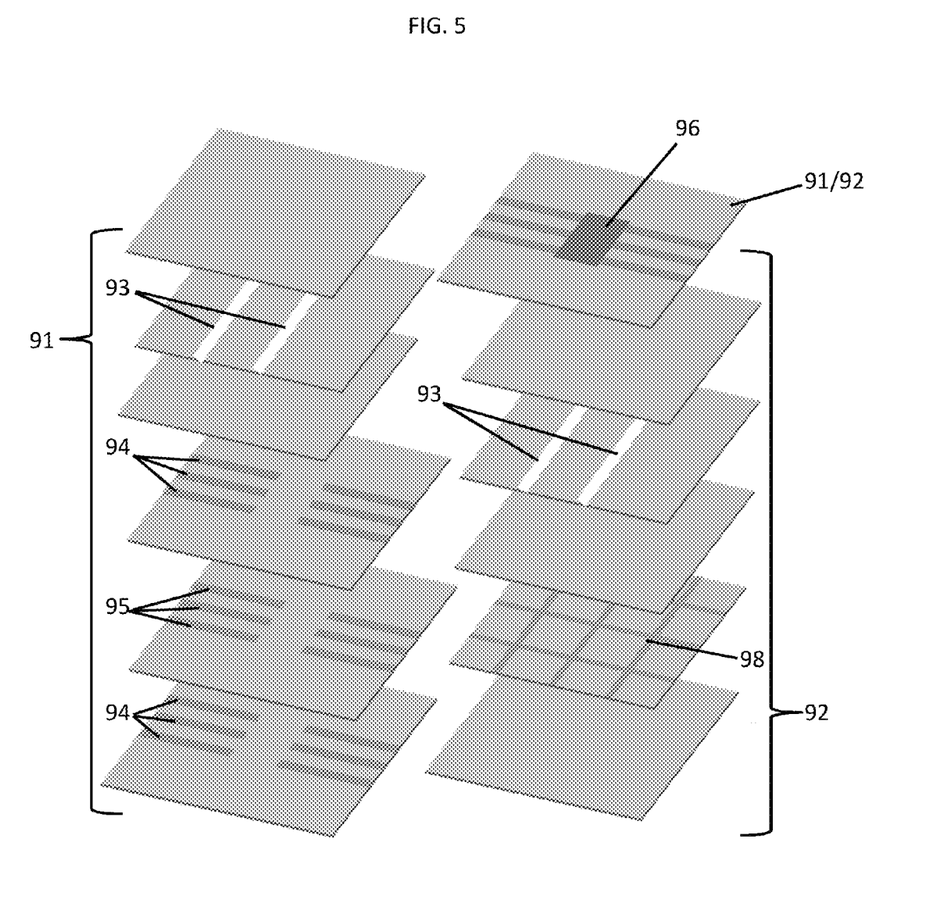
FIG. 5 is a flow diagram illustrating various combined processes executable by the machines of FIGS. 1A-4C.
Figure 6:
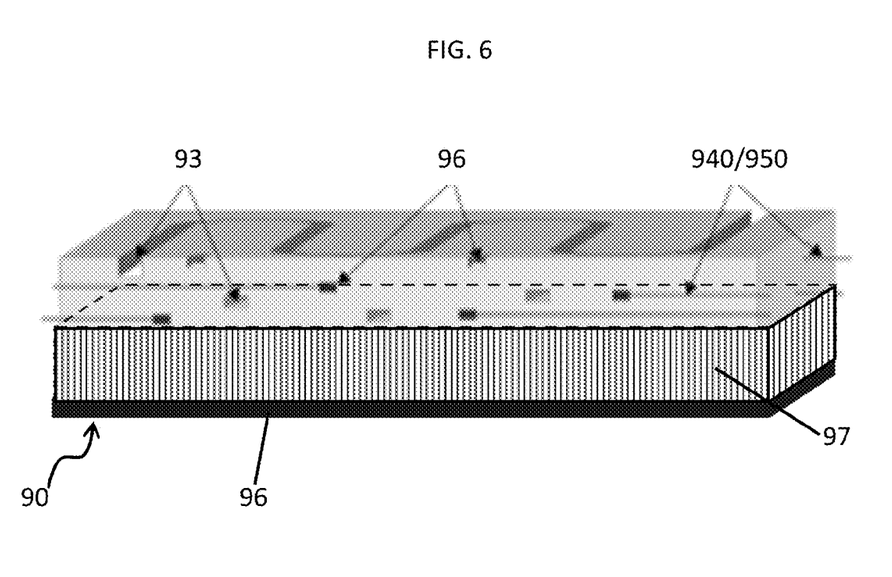
FIG. 6 is a cutaway (in multiple dimensions) perspective view of a part formed by the combined processes of FIG. 5.

With reference to FIGS. 5 and 6, a method of forming a part 90 in the machine 10 is provided. The method includes executing UC processing to lay down and assemble base metallic layers 91 and uppermost metallic layers 92 of the part 90 within the single enclosed space 12. The method further includes machining thermal or water channels 93 in a first portion of the base metallic layers 91 and in a first portion of the uppermost metallic layers 92. The machining may be performed as milling, cutting or another similar form of machining. In addition, the method includes printing dielectric components 94, conductive electronic components 95 and/or other simple electronic components, such as stress, strain or temperature sensors on a second portion of the base metallic layers 91 and on a second portion of the uppermost metallic layers 92. The printing may be performed as aerosol jet printing, depositional printing or another similar form of electronics printing. Finally, the method includes continuously maintaining a position of the part 90 within the enclosed space 12 during transitions between the executions of the UC processing, the machining and the printing.

In accordance with embodiment, the method may also include the picking and placing of complex electronic components 96 on the printed dielectric and conductive electronic components 94 and 95 as well as the placing of dissipating electronics 96 directly onto thermal sinks 97 that are integrally formed with the part 90.

In accordance with embodiments, the base metallic layers 91 may include first through fourth metallic layers that are assembled together by way of the UC processing and the uppermost metallic layers 92 may include the fourth through ninth metallic layers that are assembled together by way of the UC processing (in FIG. 5, the fourth metallic layer is illustrated four times). The machining may be performed on the second and sixth metallic layers in order to form the thermal or water channels 93 prior to the second and third metallic layers being assembled together and prior to the sixth and seventh metallic layers being assembled together or even as an initial operation before any other UC processing occurs (alternatively, the second and sixth metallic layers may be formed with the thermal or water channels 93 already formed therein).

The printing of the dielectric components 94 and the conductive electronic components 95 may be alternatively conducted on the fourth metallic layer to form dielectric traces 940 and conductive traces 950 that may be extended out of the part 90 (see FIG. 6) while an additional printing of an embedded conductive grid 98 may be executed on the eighth metallic layer to thereby enable further applications of electronics. The picking and placing of the complex electronic components 96 on the printed dielectric and conductive electronic components 94 and 95 may be conducted prior to the assembly of the fourth and fifth metallic layers such that the complex electronic components 96 are embedded into the completed part 90 in such a manner that they cannot be removed or tampered with.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

While the preferred embodiments to the invention have been described, it will be understood that those skilled in the art, both now and in the future, may make various improvements and enhancements which fall within the scope of the claims which follow. These claims should be construed to maintain the proper protection for the invention first described.

What is claimed is:

1. A machine, comprising:
   a machine body formed to define a single enclosed space;
   an ultrasonic consolidation (UC) processing element operably disposed in the single enclosed space for executing UC processing of a part within the single enclosed space; and
   an electronics printing element operably disposed in the single enclosed space for executing electronics printing of the part within the single enclosed space,
   wherein execution of the UC processing of the part within the single enclosed space by the UC processing element is distinct from execution of the electronics printing of the part within the single enclosed space by the electronics printing element.

2. The machine according to claim 1, wherein the machine body comprises:
   a base wall within the enclosed space; and
   a jig on which the part is disposable, which is disposable on the base wall.

3. The machine according to claim 1, further comprising a controller configured to control operations of the UC processing element and the electronics printing element.

4. The machine according to claim 1, wherein the UC processing element and the electronics printing element are integrated into a single processing element comprising:
   an arm capable of movement with multiple degrees of freedom;
   a UC head coupled to a distal end of the arm to execute UC processing; and
   an electronics printing head coupled to the distal end of the arm to execute electronics printing.

5. The machine according to claim 4, wherein the single processing element comprises additional head components for executing additional part processing.

6. A machine, comprising:
   a machine body formed to define a single enclosed space;
   an ultrasonic consolidation (UC) processing element operably disposed in the single enclosed space for executing UC processing of a part within the single enclosed space; and
   an electronics printing element operably disposed in the single enclosed space for executing electronics printing of the part within the single enclosed space,
   wherein the UC processing element and the electronics printing element are integrated into a single processing element comprising a pick and place component.

7. The machine according to claim 1, wherein the UC processing element comprises:
   a UC arm capable of movement with multiple degrees of freedom; and
   a UC head coupled to a distal end of the UC arm to execute UC processing.

8. The machine according to claim 7, wherein the UC processing element comprises additional head components for executing additional part processing.

9. A machine, comprising:
   a machine body formed to define a single enclosed space;
   an ultrasonic consolidation (UC) processing element operably disposed in the single enclosed space for executing UC processing of a part within the single enclosed space; and
   an electronics printing element operably disposed in the single enclosed space for executing electronics printing of the part within the single enclosed space,
   wherein the UC processing element comprises:
   a UC arm capable of movement with multiple degrees of freedom;
   a UC head coupled to a distal end of the UC arm to execute UC processing; and
   a pick and place component.

10. The machine according to claim 1, wherein the electronics printing element comprises:
    an electronics printing arm capable of movement with multiple degrees of freedom; and
    an electronics printing head coupled to a distal end of the electronics printing arm to execute electronics printing.

11. The machine according to claim 10, wherein the electronics printing element comprises additional head components for executing additional part processing.

12. A machine, comprising:
    a machine body formed to define a single enclosed space;
    an ultrasonic consolidation (UC) processing element operably disposed in the single enclosed space for executing UC processing of a part within the single enclosed space; and
    an electronics printing element operably disposed in the single enclosed space for executing electronics printing of the part within the single enclosed space,
    wherein the electronics printing element comprises:
    an electronics printing arm capable of movement with multiple degrees of freedom;
    an electronics printing head coupled to a distal end of the electronics printing arm to execute electronics printing; and
    a pick and place component.

13. A method of forming a part in a machine formed to define a single enclosed space, the method comprising:
    executing ultrasonic consolidation (UC) processing of a part within the single enclosed space;
    executing electronics printing of the part within the single enclosed space; and
    continuously maintaining a position of the part within the enclosed space during transitions between executions of the UC processing and the electronics printing.

14. The method according to claim 13, wherein the executing of the UC processing and the electronics printing comprises controlling movements and operations of a single processing element.

15. The method according to claim 14, further comprising executing additional part processing by controlling additional movements and additional operations of the single processing element.

16. The method according to claim 13, wherein the executing of the UC processing comprises controlling movements and operations of a UC processing element and the executing of the electronics printing comprises controlling movements and operations of an electronics printing element.

17. The method according to claim 15, further comprising executing additional part processing by controlling additional movements and additional operations of at least one of the UC processing element and the electronics printing element.

18. A method of forming a part in a machine formed to define a single enclosed space, the method comprising:
   executing ultrasonic consolidation (UC) processing to assemble base and uppermost layers of the part within the single enclosed space;
   machining thermal channels in a first portion of the base and uppermost layers within the single enclosed space;
   printing dielectric and conductive electronic components on a second portion of the base and uppermost layers within the single enclosed space; and
   continuously maintaining a position of the part within the enclosed space during transitions between executions of the UC processing, the machining and the printing.

19. The method according to claim 18, wherein the printing comprises aerosol jet printing and depositional printing.

20. The method according to claim 18, further comprising:
   picking and placing electronic components on the printed dielectric and conductive electronic components within the single enclosed space; and
   placing dissipating electronics directly onto integral thermal sinks within the single enclosed space.

\* \* \* \* \*